United States Patent
Xiu et al.

(10) Patent No.: US 8,699,983 B2
(45) Date of Patent: Apr. 15, 2014

(54) SIX PORT LINEAR NETWORK SINGLE WIRE MULTI SWITCH TRANSCEIVER

(75) Inventors: Lincheng Xiu, Carmel, IN (US); John James Fitzpatrick, Indianapolis, IN (US)

(73) Assignee: Thomson Licensing, Issy les Moulineaux (FR)

( * ) Notice: Subject to any disclaimer, the term of this patent is extended or adjusted under 35 U.S.C. 154(b) by 346 days.

(21) Appl. No.: 12/450,418

(22) PCT Filed: Mar. 26, 2008

(86) PCT No.: PCT/US2008/003946
§ 371 (c)(1),
(2), (4) Date: Sep. 25, 2009

(87) PCT Pub. No.: WO2008/118458
PCT Pub. Date: Oct. 2, 2008

(65) Prior Publication Data
US 2010/0071009 A1    Mar. 18, 2010

Related U.S. Application Data

(60) Provisional application No. 60/920,055, filed on Mar. 26, 2007.

(51) Int. Cl.
*H04B 1/18* (2006.01)
*H03H 2/00* (2006.01)
*H03H 3/06* (2006.01)
*H03H 7/01* (2006.01)
*H03J 3/06* (2006.01)
*H03J 3/24* (2006.01)

(52) U.S. Cl.
CPC ............... *H03H 2/008* (2013.01); *H03H 3/06* (2013.01); *H03H 7/0138* (2013.01); *H03J 3/06* (2013.01); *H03J 3/24* (2013.01)
USPC ........... 455/289; 455/299; 455/296; 455/287; 455/213; 725/64

(58) Field of Classification Search
CPC ..... H03H 2/006; H04H 2/008; H04H 7/0138; H03J 3/06; H03J 3/24
USPC ......... 455/3.02, 78, 333, 317, 341, 323, 3.06, 455/420, 425, 41.2, 67.11, 67.16, 552.1, 455/556.1, 289, 299, 296, 278, 283, 286, 455/287, 213, 233.1, 217, 222, 224; 380/10, 7; 375/257; 370/312; 341/50; 725/63, 64, 14, 71, 68, 105; 361/119
See application file for complete search history.

(56) References Cited

U.S. PATENT DOCUMENTS 4,878,245 A * 10/1989 Bradley et al. ................. 725/104
5,551,075 A *  8/1996 Caux et al. .................... 455/333

(Continued)

FOREIGN PATENT DOCUMENTS

EP    193989      9/1986
JP    8-293812    11/1996

(Continued)

OTHER PUBLICATIONS

International Search Report dtd. Feb. 26, 2009.

(Continued)

*Primary Examiner* — Tan Trinh
(74) *Attorney, Agent, or Firm* — Robert D. Shedd; Kuniyuki Akiyama

(57) ABSTRACT

A fluid sensor comprises a sensor housing (12), a sensor package (14), an actuator (16) and a switch (18). The sensor package (14) is disposed within the sensor housing (12) and includes first and second screens and at least one sensing membrane. The sensing membrane is disposed between the first and second screens (36) and is adapted to expand when exposed to a predetermined quantity of a first predetermined fluid. The actuator (16) is disposed proximate the sensor package (14) within the sensor housing (12) and moveable between a first position and a second position through an intermediate position. The switch (18) is disposed proximate the actuator (16) and is operable between closed and open positions. When the actuator (16) is in the second position at least a portion of the actuator (16) depresses the switch (18) to control an-electrical, circuit connected therewith.

10 Claims, 7 Drawing Sheets

(56) References Cited

U.S. PATENT DOCUMENTS

| | | |
|---|---|---|
| 5,576,920 A | 11/1996 | Kosuga et al. |
| 5,966,283 A | 10/1999 | Glaser et al. |
| 6,195,245 B1 | 2/2001 | Kobsa |
| 6,195,254 B1 | 2/2001 | Kobsa |
| 6,728,513 B1 | 4/2004 | Nishina |
| 6,944,878 B1 | 9/2005 | Wetzel et al. |
| 7,003,312 B2 | 2/2006 | Kemmochi et al. |
| 7,142,808 B2 | 11/2006 | Atarashi |
| 7,403,400 B2 * | 7/2008 | Stanley .................. 363/16 |
| 7,471,962 B2 | 12/2008 | Kemmochi et al. |
| 7,814,527 B2 | 10/2010 | Bertin et al. |
| 8,081,412 B2 | 12/2011 | Fitzpatrick et al. |
| 2002/0146997 A1 * | 10/2002 | Koizumi et al. .............. 455/323 |
| 2002/0183016 A1 | 12/2002 | Kemmochi et al. |
| 2004/0077307 A1 | 4/2004 | Atarashi |
| 2004/0209584 A1 | 10/2004 | Bargroff et al. |
| 2005/0017699 A1 * | 1/2005 | Stanley .................. 323/282 |
| 2005/0024543 A1 | 2/2005 | Ramaswamy et al. |
| 2005/0036263 A1 | 2/2005 | Michon et al. |
| 2005/0059358 A1 * | 3/2005 | Block et al. .................. 455/78 |
| 2005/0190777 A1 | 9/2005 | Hess et al. |
| 2005/0193419 A1 | 9/2005 | Lindstrom et al. |
| 2006/0030355 A1 | 2/2006 | Kemmochi et al. |
| 2006/0050796 A1 * | 3/2006 | Chambelin et al. .......... 375/257 |
| 2006/0056121 A1 | 3/2006 | Esmark et al. |
| 2006/0154602 A1 | 7/2006 | Lee |
| 2006/0174282 A1 * | 8/2006 | Dennison et al. .............. 725/68 |
| 2006/0225098 A1 | 10/2006 | James et al. |
| 2006/0225099 A1 | 10/2006 | James et al. |
| 2006/0225100 A1 * | 10/2006 | James et al. .................... 725/63 |
| 2006/0225101 A1 | 10/2006 | James et al. |
| 2006/0225102 A1 | 10/2006 | James et al. |
| 2006/0225103 A1 | 10/2006 | James et al. |
| 2006/0225104 A1 | 10/2006 | James et al. |
| 2006/0238387 A1 * | 10/2006 | Bertin et al. .................... 341/50 |
| 2007/0025043 A1 | 2/2007 | Terada et al. |
| 2007/0054628 A1 | 3/2007 | Rowe et al. |
| 2007/0242633 A1 * | 10/2007 | Roberts et al. ................ 370/312 |
| 2007/0250909 A1 * | 10/2007 | James et al. ...................... 726/4 |
| 2008/0016535 A1 * | 1/2008 | James et al. .................... 725/63 |
| 2010/0053836 A1 * | 3/2010 | Xiu et al. ...................... 361/119 |
| 2010/0105318 A1 | 4/2010 | Fitzpatrick et al. |
| 2011/0307916 A1 * | 12/2011 | James et al. .................... 725/14 |

FOREIGN PATENT DOCUMENTS

| | | |
|---|---|---|
| JP | 2001-127661 | 5/2001 |
| JP | 2001-177430 | 6/2001 |
| JP | 2003-505924 | 2/2003 |
| JP | 2004-140594 | 5/2004 |
| JP | 2006-295933 | 10/2006 |
| WO | 01/48935 A1 | 7/2001 |
| WO | WO0245417 | 6/2002 |
| WO | WO2005094212 | 10/2005 |
| WO | WO2005114879 | 12/2005 |
| WO | 2006/026477 A1 | 3/2006 |
| WO | WO2006065747 | 6/2006 |
| WO | WO2006107863 | 10/2006 |
| WO | WO2006107868 | 10/2006 |
| WO | WO2006107869 | 10/2006 |
| WO | WO2006107870 | 10/2006 |
| WO | WO2006107871 | 10/2006 |
| WO | WO2006107873 | 10/2006 |
| WO | WO2006107874 | 10/2006 |
| WO | WO2007022693 | 3/2007 |
| WO | WO2007040573 | 4/2007 |
| WO | WO2007056108 | 5/2007 |
| WO | WO2007126573 | 11/2007 |
| WO | WO2007133319 | 11/2007 |
| WO | WO2008140759 | 11/2008 |

OTHER PUBLICATIONS

International Preliminary Report on Patentability, date of issuance: Sep. 29, 2009.
International Search Report, date of mailing: Jun. 26, 2008.
Non-final office action dated Feb. 2, 2012.

* cited by examiner

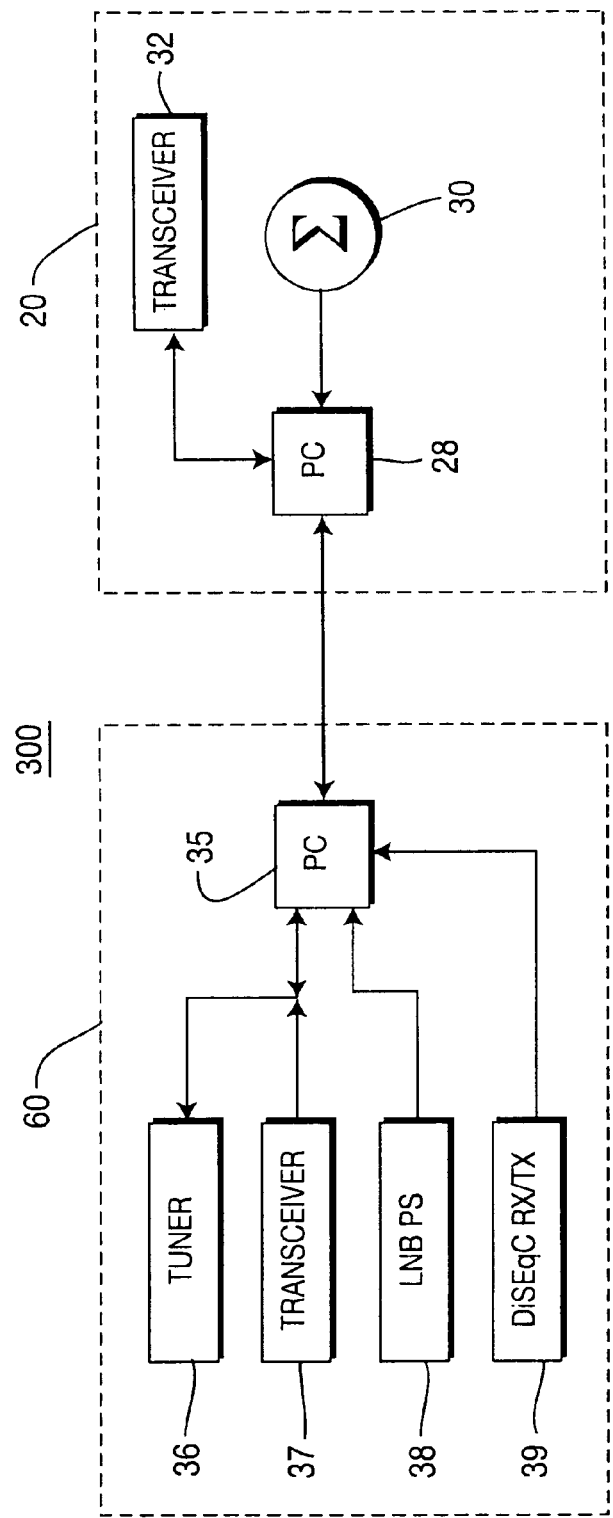
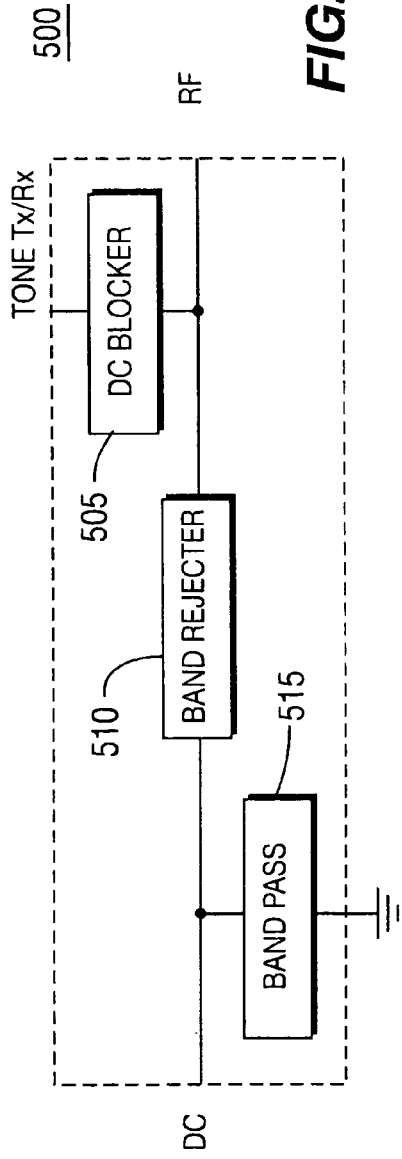

SIX PORT LINEAR NETWORK SINGLE WIRE MULTI SWITCH TRANSCEIVER

RELATED APPLICATION

This application claims the benefit, under 35 U.S.C. §365 of International Application PCT/US2008/003946 filed Mar. 26, 2008 which was published in accordance with PCT Article 21(2) on Oct. 2, 2008 in English and which claims the benefit of U.S. provisional patent application No. 60/920,055 filed Mar. 26, 2007.

BACKGROUND OF THE INVENTION

1. Field of the Invention

The present invention generally relates to signal communications, and more particularly, to architecture for integrating a single wire multi switch (SWM) transceiver and the legacy LNB mode into the same satellite set top box.

2. Background Information

In a satellite broadcast system, one or more satellites receive signals including audio and/or video signals from one or more earth-based transmitters. The satellite(s) amplify and rebroadcast these signals to signal receiving equipment at the dwellings of consumers via transponders that operate at specified frequencies and have prescribed bandwidths. Such a system includes an uplink transmitting portion (i.e., earth to satellite(s)), an earth-orbiting satellite receiving and transmitting portion, and a downlink portion (i.e., satellite(s) to earth).

In dwellings that receive signals from a satellite broadcast system, signal receiving equipment may be used to frequency shift the entire broadcast spectrum of the satellite(s), and frequency stack the resultant output onto a single coaxial cable. However, as the number of satellites within a satellite broadcast system increases, and with the proliferation of high definition satellite channels, a point will be reached where the total bandwidth required to accommodate all of the satellites will exceed the transmission capability of the coaxial cable. It has become necessary for the satellite decoder industry to implement more satellite slots into their distribution systems. To provide for the increased number of satellite slot transmissions a more elaborate means for satellite configurations selection is required. The two primary methods, used now for selecting these various configurations are the legacy LNB power supply method and the new Frequency Translation Module (SWM) method.

The legacy LNB power supply method controls satellite RF tone on or off selection by voltage level and a superimposed, 600 mvp-p, 22 kHz tone. Tone selection is accomplished by either a constant tone or a Pulse Width Modulated (PWM) tone. The industry standard for the PWM tone is called DiSEqC and is defined in the Eutelsat DiSEqC Bus Functional Specification. The two stage, output voltage (13 or 18 volts) is typically used to select the polarity of incoming satellite signals and the tone selects various satellite slots in space.

The second method (SWM) is self powered, therefore, it does not require an LNB power supply, and uses a UART controlled 2.3 MHz, Frequency Shift Key (FSK) modulation scheme to communicate selection commands to the satellite configuration switch. Other modulation methods may be substituted for the UART modulation method. The SWM switch is designed to select a satellite signal transponder from a host of satellite receiver antennas and translate it, in frequency, to a single transponder. This new frequency shifted transponder band is then sent to the satellite decoder box through the connecting coax cable.

Present day satellite decoder systems need the ability to switch between these two communication methods and operate in either mode without being disturbed by the other system. If a satellite receiver system is capable of SWM operation, the conventional LNB power supply will be disabled such that all control and selection of the available satellite signals is done with the modulated 2.3 MHz, SWM communication channel.

However, a problem arises when multiple circuits are coupled to the RF conductor of the coaxial cable where each circuit is required to perform a different task. For example, the SWM requires the outdoor unit to 20V power supply to co-exist with the 2.3 MHz tone on the same RF cable. The low impedance of the 20V DC power supply may short the 2.3 MHz tone to ground and result in 2.3 MHz SWM failure. Furthermore, some current satellite systems required the 5 MHz to 30 MHz band to be reserved for home networking use. The low impedance of the 20 volt power supply will also short this frequency band to ground.

An additional concern arises in that the 2.3 MHz SWM tone could cause harmonics to arise on the shared RF cable. These harmonics may interrupt other working systems on the shared RF cable. The 2.3 MHz SWM tone can be as high as 0.7 volts. If such a voltage is applied on surge protection diode or a transistor b-e junction, harmonic could occur on the RF coax cable and affects other working unit on same conductor.

Additionally, all the circuitry of the SWM system must be protected from voltage and current surges generated by environmental conditions, such as lightning. The SWM system must coexist with this surge protection and harmonic cancellation circuitry. Thus, it is desirable to have a circuit which can withstand high surge and has low capacitance to ground without disturbing the RF program signals, the SWM tone or DC supply voltages while addressing the above stated problems. The present invention described herein addresses these and/or other problems that presently exist.

SUMMARY OF THE INVENTION

In accordance with an aspect of the present invention, an apparatus is provided. The apparatus comprises a first DC voltage block coupled between a source of a first RF signal having a first frequency and a first transmission line, a second DC voltage block coupled between a source of a DC potential and a source of reference potential, and a first band reject filter for rejecting said first frequency, coupled between said source of the DC potential and the first transmission line.

In accordance with another aspect of the present invention, the apparatus further comprises a third DC voltage block coupled between a source of a second RF signal and a second transmission line, said second RF signal having a second frequency, a second band reject filter for rejecting said second frequency, coupled between said first transmission line and the second transmission line, and a low pass filter coupled between the first transmission line and the source of reference potential.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 3 is a diagram showing further details of the LNB and IRD LNB control transceivers according to an exemplary embodiment of the present invention;

FIG. 5 is a block diagram showing details of a transceiver passive linear switch according to an exemplary embodiment of the present invention;

The exemplifications set out herein illustrate preferred embodiments of the invention, and such exemplifications are not to be construed as limiting the scope of the invention in any manner.

DESCRIPTION OF THE PREFERRED EMBODIMENTS

Figure 1:
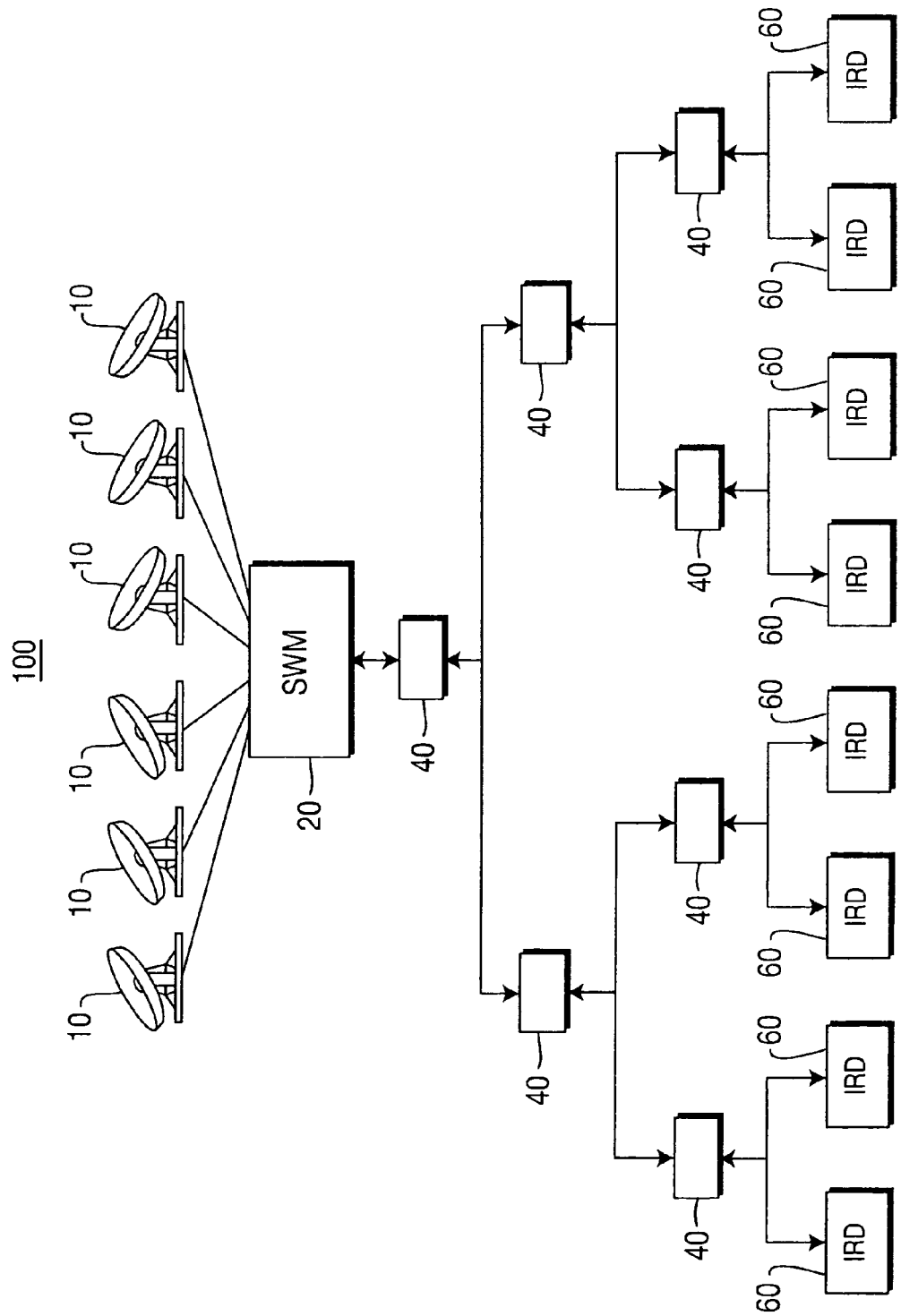
FIG. 1 is a diagram showing an exemplary environment for implementing the present invention.

Referring now to the drawings, and more particularly to FIG. 1, a diagram of an exemplary environment 100 for implementing the present invention is shown. Environment 100 of FIG. 1 comprises a plurality of signal receiving means such as signal receiving elements 10, such as antennas or portions of an antenna or transmission line inputs or low noise block amplifer any other means for receiving an information bearing signal, frequency translating means such as SWM 20, a plurality of signal splitting means such as signal splitters 40, and a plurality of signal receiving and decoding means such as IRDs 60. The signal receiving elements 10 may be operative to shift the frequency of received signals to frequencies more conducive to transmission via transmission lines such as coaxial cables. For example, a low noise block amplifier used in satellite television signal reception may be operative to frequency shift the received signal from around 12 GHz o 1 GHz, or from "Ka" band to "L" band. According to an exemplary embodiment described herein, the aforementioned elements of environment 100 are operatively coupled to one another via a transmission medium such as coaxial cable, although other types of transmission mediums may also be used according to the present invention. Environment 100 may for example represent a signal communication network within a given household and/or business dwelling.

Signal receiving elements 10 are each operative to receive signals including audio, video, and/or data signals (e.g., television signals, etc.) from one or more signal sources, such as a satellite broadcast system and/or other type of signal broadcast system. According to an exemplary embodiment, signal receiving element 10 is embodied as an antenna such as a satellite receiving dish, but may also be embodied as any type of signal receiving element.

SWM 20 is operative to receive signals including audio, video, and/or data signals (e.g., television signals, etc.) from signal receiving elements 10, and process the received signals using functions including signal tuning and frequency translation functions to generate corresponding output signals that are provided to IRDs 60 via coaxial cable and signal splitters 40. According to an exemplary embodiment, SWM 20 may communicate with up to 12 IRDs 60 within a single dwelling. For purposes of example and explanation, however, FIG. 1 shows SWM 20 connected to 8 IRDs 60 using simple two-way signal splitters 40. Further exemplary details regarding SWM 20, and its ability to communicate with IRDs 60 will be provided later herein.

Signal splitters 40 are each operative to perform a signal splitting and/or repeating function. According to an exemplary embodiment, signal splitters 40 are each operative to perform a 2-way signal splitting function to facilitate signal communication between SWM 20 and IRDs 60.

IRDs 60 are each operative to perform various signal receiving and processing functions including signal tuning, demodulation and decoding functions. According to an exemplary embodiment, each IRD 60 is operative to tune, demodulate and decode signals provided from SWM 20 via signal splitters 40, and enable aural and/or visual outputs corresponding to the received signals. As will be described later herein, such signals are provided from SWM 20 to IRDs 60 responsive to request commands from IRDs 60, and such request commands may each represent a request for a desired band of television signals. With a satellite broadcast system, each request command may for example indicate a desired satellite and/or a desired transponder. The request commands may be generated by IRDs 60 responsive to user inputs (e.g., via remote control devices, etc.).

According to an exemplary embodiment, each IRD 60 also includes an associated audio and/or video output device such as a standard-definition (SD) and/or high-definition (HD) display device. Such display device may be integrated or non-integrated. Accordingly, each IRD 60 may be embodied as a device such as a television set, computer or monitor that includes an integrated display device, or a device such as a set-top box, video cassette recorder (VCR), digital versatile disk (DVD) player, video game box, personal video recorders (PVR), computer or other device that may not include an integrated display device.

Figure 2:
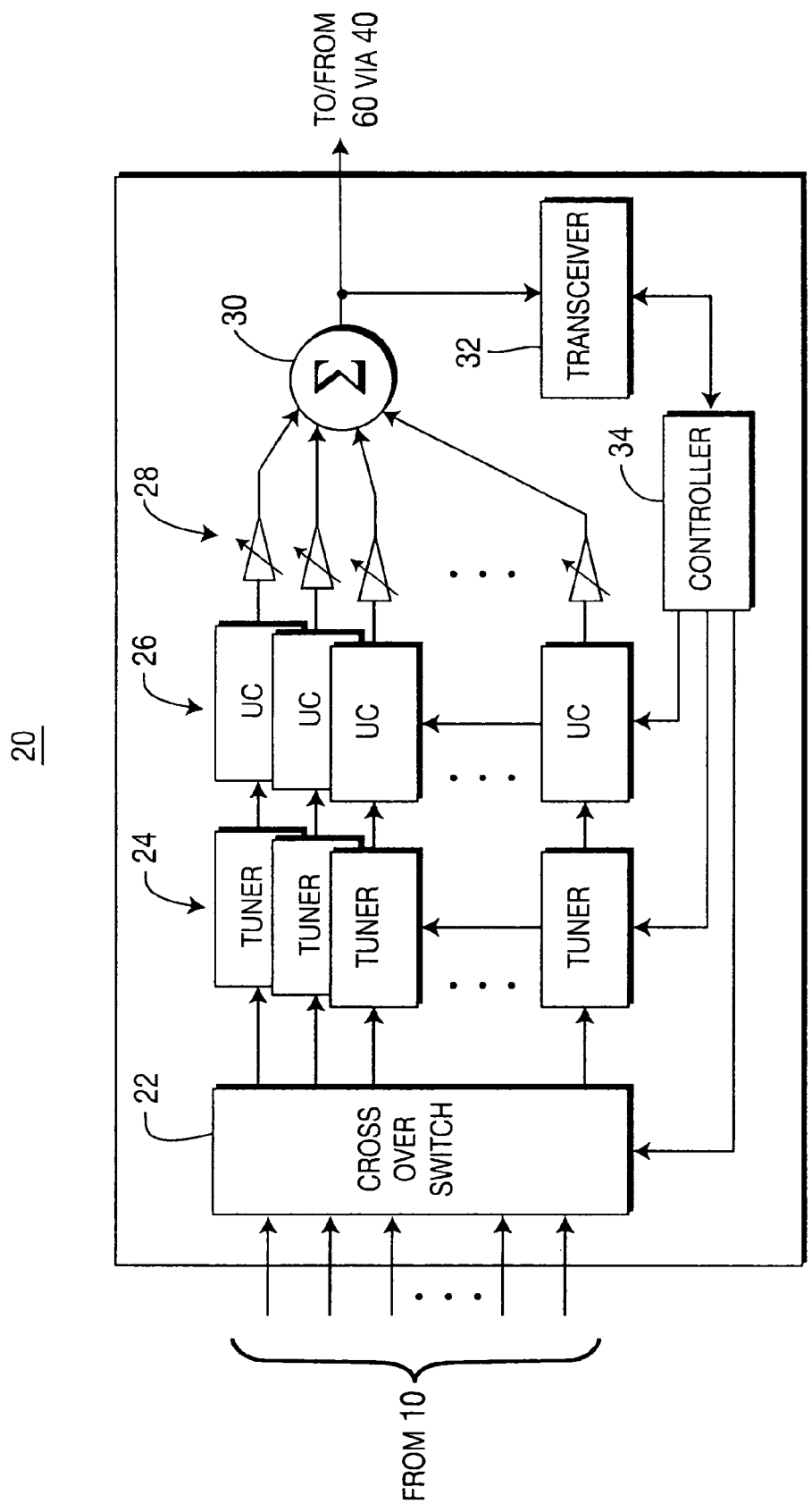
FIG. 2 is a block diagram showing further details of the SWM of FIG. 1 according to an exemplary embodiment of the present invention.

Referring to FIG. 2, a block diagram providing further details of SWM 20 of FIG. 1 according to an exemplary embodiment of the present invention is shown. SWM of FIG. 2 comprises switching means such as cross over switch 22, a plurality of tuning means such as tuners 24, a plurality of frequency converting means such as frequency up converters (UCs) 26, a plurality of amplifying means such as variable gain amplifiers 28, signal combining means such as signal combiner 30, transceiving means such as transceiver 32, and control means such as controller 34. The foregoing elements of SWM 20 may be implemented using integrated circuits (ICs), and one or more elements may be included on a given IC. Moreover, a given element may be included on more than one IC. For clarity of description, certain conventional elements associated with SWM 20 such as certain control signals, power signals and/or other elements may not be shown in FIG. 2.

Cross over switch 22 is operative to receive a plurality of input signals from signal receiving elements 10. According to an exemplary embodiment, such input signals represent various bands of radio frequency (RF) television signals. With a satellite broadcast system, such input signals may for example represent L-band signals, and cross over switch 22 may include an input for each signal polarization used within the system. Also according to an exemplary embodiment, cross over switch 22 selectively passes the RF signals from its inputs to specific designated tuners 24 responsive to control signals from controller 34.

Tuners 24 are each operative to perform a signal tuning function responsive to a control signal from controller 34. According to an exemplary embodiment, each tuner 24 receives an RF signal from cross over switch 22, and performs the signal tuning function by filtering and frequency down converting (i.e., single or multiple stage down conversion) the RF signal to thereby generate an intermediate frequency (IF) signal. The RF and IF signals may include audio, video and/or data content (e.g., television signals, etc.), and may be of an analog signal standard (e.g., NTSC, PAL, SECAM, etc.) and/or a digital signal standard (e.g., ATSC, QAM, QPSK, etc.). The number of tuners 24 included in SWM 20 is a matter of design choice.

Frequency up converters (UCs) 26 are each operative to perform a frequency translation function. According to an exemplary embodiment, each frequency up converter (UC) 26 includes a mixing element and a local oscillator (not shown in FIGS.) that frequency up converts an IF signal provided from a corresponding tuner 24 to a designated frequency band responsive to a control signal from controller 34 to thereby generate a frequency up converted signal.

Variable gain amplifiers 28 are each operative to perform a signal amplification function. According to an exemplary embodiment, each variable gain amplifiers 28 is operative to amplify a frequency converted signal output from a corresponding frequency up converter (UC) 26 to thereby generate an amplified signal. Although not expressly shown in FIG. 2, the gain of each variable gain amplifier 28 may be controlled via a control signal from controller 34.

Signal combiner 30 is operative to perform a signal combining (i.e., summing) function. According to an exemplary embodiment, signal combiner 30 combines the amplified signals provided from variable gain amplifiers 28 and outputs the resultant signals onto a transmission medium such as coaxial cable for transmission to one or more IRDs 60 via signal splitters 40.

Transceiver 32 is operative to enable communications between SWM 20 and IRDs 60. According to an exemplary embodiment, transceiver 32 receives various signals from IRDs 60 and relays those signals to controller 34. Conversely, transceiver 32 receives signals from controller 34 and relays those signals to one or more IRDs 60 via signal splitters 40. Transceiver 32 may for example be operative to receive and transmit signals in one or more predefined frequency bands. For example, communications may be made by RF signal in a low frequency band, such as 2.3 MHz, with UART modulation scheme.

Controller 34 is operative to perform various control functions. According to an exemplary embodiment, controller 34 receives request commands for desired bands of television signals from IRDs 60. As will be described later herein, each IRD 60 may transmit its request command to SWM 20 during a separate time slot that is assigned by controller 34. With a satellite broadcast system, a request command may indicate a desired satellite and/or a desired transponder that provides a desired band of television signals. Controller 34 enables signals corresponding to the desired bands of television signals to be transmitted to corresponding IRDs 60 responsive to the request commands.

According to an exemplary embodiment, controller 34 provides various control signals to cross over switch 22, tuners 24, and frequency up converters (UCs) 26 that cause the signals corresponding to the desired bands of television signals to be transmitted to IRDs 60 via a transmission medium such as coaxial cable. Controller 34 also provides acknowledgement responses to IRDs 60 responsive to the request commands which indicate the frequency bands (e.g., on the coaxial cable, etc.) that will be used to transmit the signals corresponding to the desired bands of television signals to IRDs 60. In this manner, controller 34 may allocate the available frequency spectrum of the transmission medium (e.g., coaxial cable, etc.) so that all IRDs 60 can receive desired signals simultaneously.

Referring to FIG. 3 a diagram of an exemplary environment 300 for implementing the present invention is shown showing further details of the interconnectivity between the SWM 20 and IRD 60 of FIG. 1. Environment 300 of FIG. 3 comprises a protection circuit 31, a transceiver 32, and a signal combiner 30 within the SWM 20. Within the IRD 60, a tuner 36, a transceiver 37, an LNB power supply 38, a DiSEqC encoder/decoder 39, and a protection circuit 35.

Protection circuit 31 is operative to pass desired signals, such as 22 kHz tone on DC voltage, SWM control signals, and television signals without distortion while protecting the SWM circuitry from lightning surge and other environmental electrical disturbances. According to an exemplary embodiment, protection circuit 31 comprises surge protection diodes implemented to absorb energy from positive and negative lightning surge events. The surge protection diodes are configured not to present a non-linear conduction path to the 2.3 MHz SWM signal.

Signal combiner 30 is operative to perform a signal combining (i.e., summing) function. According to an exemplary embodiment, signal combiner 30 combines the amplified signals provided from variable gain amplifiers 28 and outputs the resultant signals onto a transmission medium such as coaxial cable for transmission to one or more IRDs 60 via signal splitters 40.

Transceiver 32 is operative to enable communications between SWM 20 and IRDs 60. According to an exemplary embodiment, transceiver 32 receives various signals from IRDs 60 and relays those signals to controller 34. Conversely, transceiver 32 receives signals from controller 34 and relays those signals to one or more IRDs 60 via signal splitters 40. Transceiver 32 may for example be operative to receive and transmit signals in one or more predefined frequency bands.

Protection circuit 35 is operative to pass desired signals, such as SWM control signals, 22 kHz DiSEqC signals, and television signals without distortion while protecting the IRD 60 circuitry from lightning surge and other environmental electrical disturbances. According to an exemplary embodiment, protection circuit 35 comprises surge protection diodes implemented to absorb energy from positive and negative lightning surge events. The surge protection diodes are configured not to present a non-linear conduction path to the 2.3 MHz SWM signal or the incoming television signals transmitted from the SWM 20.

Tuner 36 is operative to perform a signal tuning function responsive to a control signal from IRD controller in response to a channel selection from the user. According to an exemplary embodiment, the tuner receives an RF signal via protection circuit 35, and performs the signal tuning function by filtering and frequency down converting (i.e., single or multiple stage down conversion) the RF signal to thereby generate an intermediate frequency (IF) signal. The RF and IF signals may include audio, video and/or data content (e.g., television signals, etc.), and may be of an analog signal standard (e.g., NTSC, PAL, SECAM, etc.) and/or a digital signal standard (e.g., ATSC, QAM, QPSK, etc.).

Transceiver 37 is operative to enable communications between SWM 20 and IRDs 60. According to an exemplary embodiment, transceiver 37 receives various signals from SWM 20 and relays those signals to the IRD controller. Conversely, transceiver 37 receives signals from IRD controller and relays those signals to the SWM via coaxial cable and protection circuits 31 and 35. Transceiver 37 may for example be operative to receive and transmit signals in one or more predefined frequency bands.

The LNB power supply 38 is operative to generate the required operating DC power for the LNBs when the system is operating in Legacy LNB mode. According to an exemplary embodiment, the LNB power supply 38 is a conventional LNB power supply comprising a DC to DC, switching power supply feeding a linear regulator which can superimpose a 22 kHz tone onto the DC output voltage. The LNB power supply has the ability to power down or disable the output. The output of the linear regulator is typically a push-pull type, but can equally be other configurations, such as emitter follower type output.

The DiSEqC encoder and decoder 39 is operative to utilize a 22 kHz signal or other required control tones to communicate to the LNBs when the IRD is operating in the Legacy mode. The DiSEqC encoder and decoder 39 may be further operative to generate and transmit 22 kHz current pulses to communicate with the LNBs. According to an exemplary embodiment, there are two 22 kHz tone modes, constant tone and two-way pulse width modulated (PWM) tone control mode. When the LNB regulator is transmitting tone, the DiSEqC encoder and decoder 39 provides a low impedance output to the switch 33.

Figure 4:
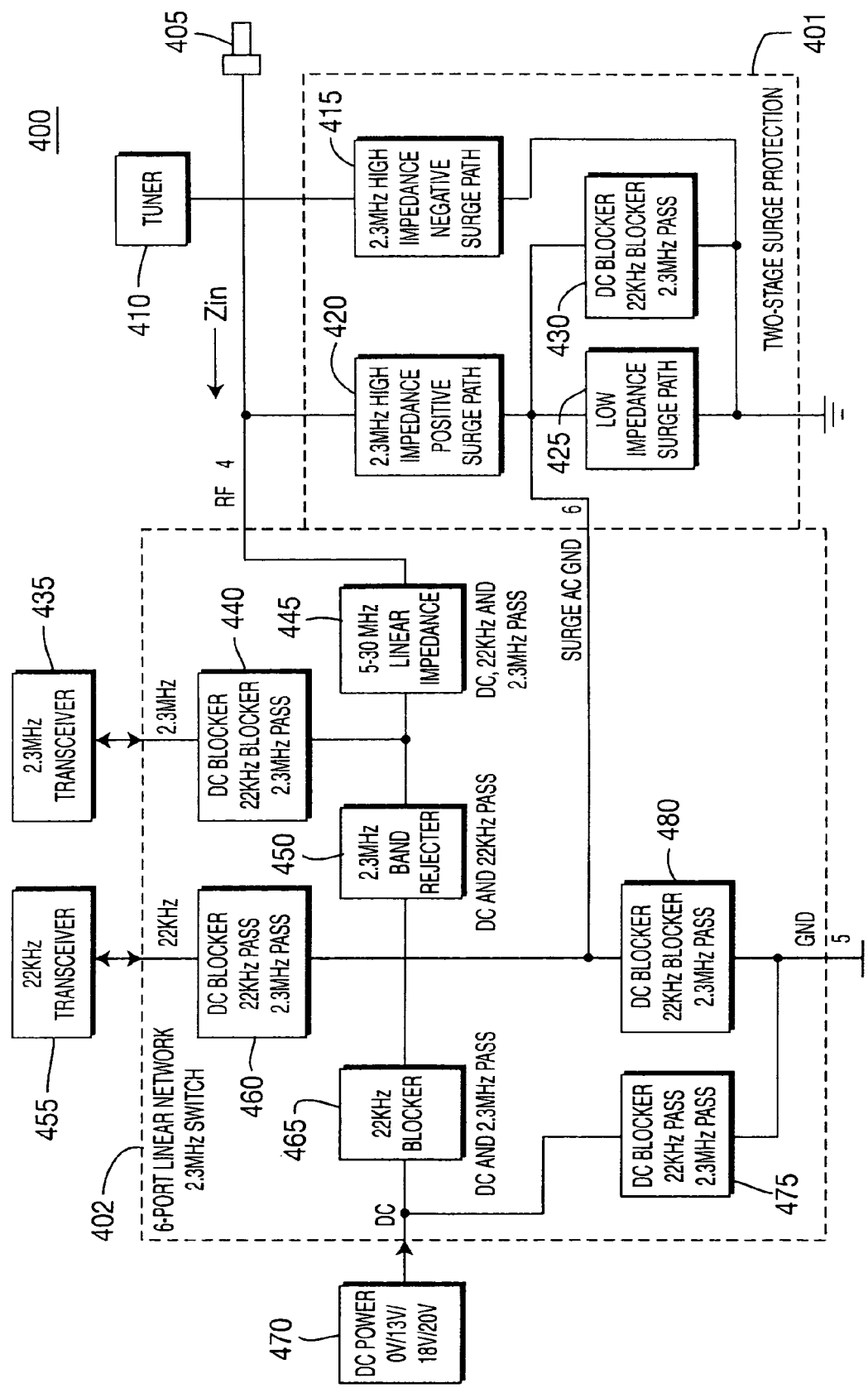
FIG. 4 is a block diagram showing further details of the SWM linear switch block according to an exemplary embodiment of the present invention.

Referring now to FIG. 4, a block diagram showing further details of the SWM linear switch block 400 according to an exemplary embodiment of the present invention is shown. The SWM linear switch block 400 comprises two main portions, a two stage surge protection circuit 401 and a 6 port linear network switch circuit 402. According to the exemplary embodiment, the SWM linear switch block 400 is present within the IRD, and comprises a coupling to the RF input 405, a tuner 410, a 2.3 MHz high impedance negative surge path 415, a 2.3 MHz high impedance positive surge path 420, a low impedance surge path 425, a first DC blocker 22 kHz blocker 2.3 MHz pass circuit 430, a 2.3 MHz transceiver 435, a second DC blocker 22 kHz blocker 2.3 MHz pass circuit 440, a 5-30 MHz linear impedance circuit 445, a 2.3 MHz band rejecter circuit 450, a first DC blocker 22 kHz pass 2.3 MHz pass circuit 460, a 22 kHz transceiver 455, a 22 KHz blocker circuit 465, a DC power supply 470, a second DC blocker 22 kHz pass 2.3 MHz pass circuit 475 and a third DC blocker 22 kHz blocker 2.3 MHz pass circuit 480.

The coupling to the RF input 405 is operative to receive RF signals from the LNB and is further operative to provide a control signals from the 2.3 MHz transceiver 435 and the 22 kHa transceiver 455 to the SWM and legacy LNB circuitry outside of the IRD. The RF input 405 is generally the point most likely to be the point of entry to the circuitry of lightning surge and other environmental electrical disturbances. The 2.3 MHz high impedance negative surge path 415 is operative to conduct negative surges to ground, while presenting high impedance to 2.3 MHz signals. The 2.3 MHz high impedance positive surge path 420 is operative to conduct positive surges to low impedance surge path 425, while presenting high impedance to 2.3 MHz signals. The low impedance surge path 425 is operative to conduct operative to conduct the 2.3 MHz to ground, to block the conduction of the 22 KHz tone to ground, operative to conduct the high current surge pulse to ground. An exemplary implementation of the low impedance surge path 425 is a zener diode. Thus, any high current surge passing through the 2.3 MHz high impedance positive surge path 420 will be clamped by the zener diode. Another exemplary implementation of the low impedance surge path 425 is a transient voltage suppressor (TVS) diode. The first DC blocker 22 kHz blocker 2.3 MHz pass circuit 430 is operative to conduct the 2.3 MHz signal to ground and to compensate for any non linear effects resultant from the low impedance surge path 425.

The 2.3 MHz transceiver 435 is operative to transmit and receive commands to the SWM using a 2.3 MHz signal. A second DC blocker 22 kHz blocker 2.3 MHz pass circuit 440 is operative to conduct the 2.3 MHz SWM signal, but prevent 22 KHz signals and DC voltages from being conducted to the 2.3 MHz Transceiver 435. The 5-30 MHz linear impedance circuit 445 is operative to transmit and receive 22 KHz signals, 2.3 SWM signals, and DC voltage to the LNB, antenna, or other switching circuitry. 22 kHz signals may employ the DiSEqC communications protocol. Furthermore, the 5-30 MHz linear impedance circuit 445 is operative to prevent transmission of the RF satellite signals present at the RF input 405 through to the transceivers 435 455 and the DC power supply 470.

The 2.3 MHz band rejecter circuit 450 is operative to conduct a DC voltage from the DC power supply 470 and the 22 kHz signal from the 22 kHz transceiver 45. The 2.3 MHz band rejecter circuit 450 is further operative to impede the conductance of the 2.3 MHz signal. Specifically, the band rejecter circuit 450 prevents the 2.3 MHz SWM control signals from being conducted to the DC power supply 470.

The first DC blocker 22 kHz pass 2.3 MHz pass circuit 460 is operative to conduct the 22 kHz signal from the 22 kHz transceiver 455, but to prevent 2.3 MHz signals and DC voltages from being conducted to the 22 kHz Transceiver 455. The 22 kHz transceiver 455 is operative to transmit and receive 22 kHz control signals. These 22 kHz control signals are generally formatted according to the DiSEqC standard. The 22 KHz blocker circuit 465 is operative to conduct the DC power and any 2.3 MHz signal, but to impede the 22 kHz signal generated by the 22 kHz transceiver 455. A second DC blocker 22 kHz pass 2.3 MHz pass circuit 475 is operative to isolate the DC voltage to from the source of reference potential, but to pass both 22 kHz and 2.3 MHz signals to ground. The third DC blocker 22 kHz blocker 2.3 MHz pass circuit 480 is operative to isolate the DC voltage and the 22 kHz signal from ground but to conduct the 2.3 MHz signals to ground.

The DC power supply 470, is operative to supply any or all of the needed DC voltages to the SWM or the legacy LNBs. For example, the SWM can be operated on a 20v DC supply, whereas the legacy LNBs are generally operated using 13, 14 and/or 18 volts DC.

RF Input Tuner 410 is operative to receive and tune satellite signals from the RF signal input and the SWM. An exemplary satellite signal band has a frequency range of 940 MHz to 2150 MHz.

The SWM linear switch block 400 is configured in such a manner that it is operative to conduct voltages and signals in the direction toward the RF input 405, and away from the DC power supply. Thus, as can be seen in the exemplary embodiment of FIG. 4, the DC power is conducted across both the 22 KHz Blocker 465 and the 2.3 MHz band rejecter 450. Any 22 kHz or 2.3 MHz that is conducted through the 22 KHz Blocker 465 and the 2.3 MHz band rejecter 450 circuits respectively are then couple to ground to prevent interference to DC power supply or the other transceivers.

Referring now to FIG. 5, a block diagram showing details of a transceiver passive linear switch 500 according to an exemplary embodiment of the present invention is shown. The transceiver passive linear switch 500 comprises a DC blocker circuit 505, a band rejecter circuit 510, and a band pass circuit 515.

The DC blocker circuit 505 is coupled between a source of a tone transceiver (Tone Tx/Rx) and a coupling to the RF signal path which couples the transceiver passive linear switch 500 to the SWM. The DC blocker circuit 505 is operative to conduct the SWM tone used to communicate with the SWM. The DC blocker circuit is further operative to block any DC supply voltage present on the RF conductor from coupling into the tone transceiver. The DC block circuitry 505 can be configured as a bandpass filter operative to conduct only the frequencies of interest originating from the tone transceiver. Furthermore, the DC block circuitry 505 can be configured as a high pass filter with the cutoff below the frequency of interest of the tone originating from the tone transceiver.

The band rejecter circuit 510 is operative to conduct the DC supply voltage to the RF signal path, but to prevent the SWM tone from being conducted to the source of DC voltage. The band rejecter circuitry can be configured as a band reject filter operative to prevent the conduction of only the frequencies of interest originating from the tone transceiver. Furthermore, the band rejecter circuitry 510 can be configured as a parallel high pass filter and low pass filter with the cutoff of each filter overlapping such that the SWM tone is always prevented from being conducted to the source of DC power.

The band pass circuit 515 is operative to conduct and unwanted RF signals to ground, but to prevent the DC voltage supplied by the DC voltage source from being coupled to ground.

Thus, the transceiver passive linear switch 500 is operative to conduct DC supply voltage to the RF signal path, but prevents SWM control tones from being coupled through the band rejecter circuit 510 to the source of DC power. Any tone energy that does get conducted through the band reject circuit 510 can be coupled to ground, and diminished as a source of interference by the band pass circuit 515.

Figure 6:
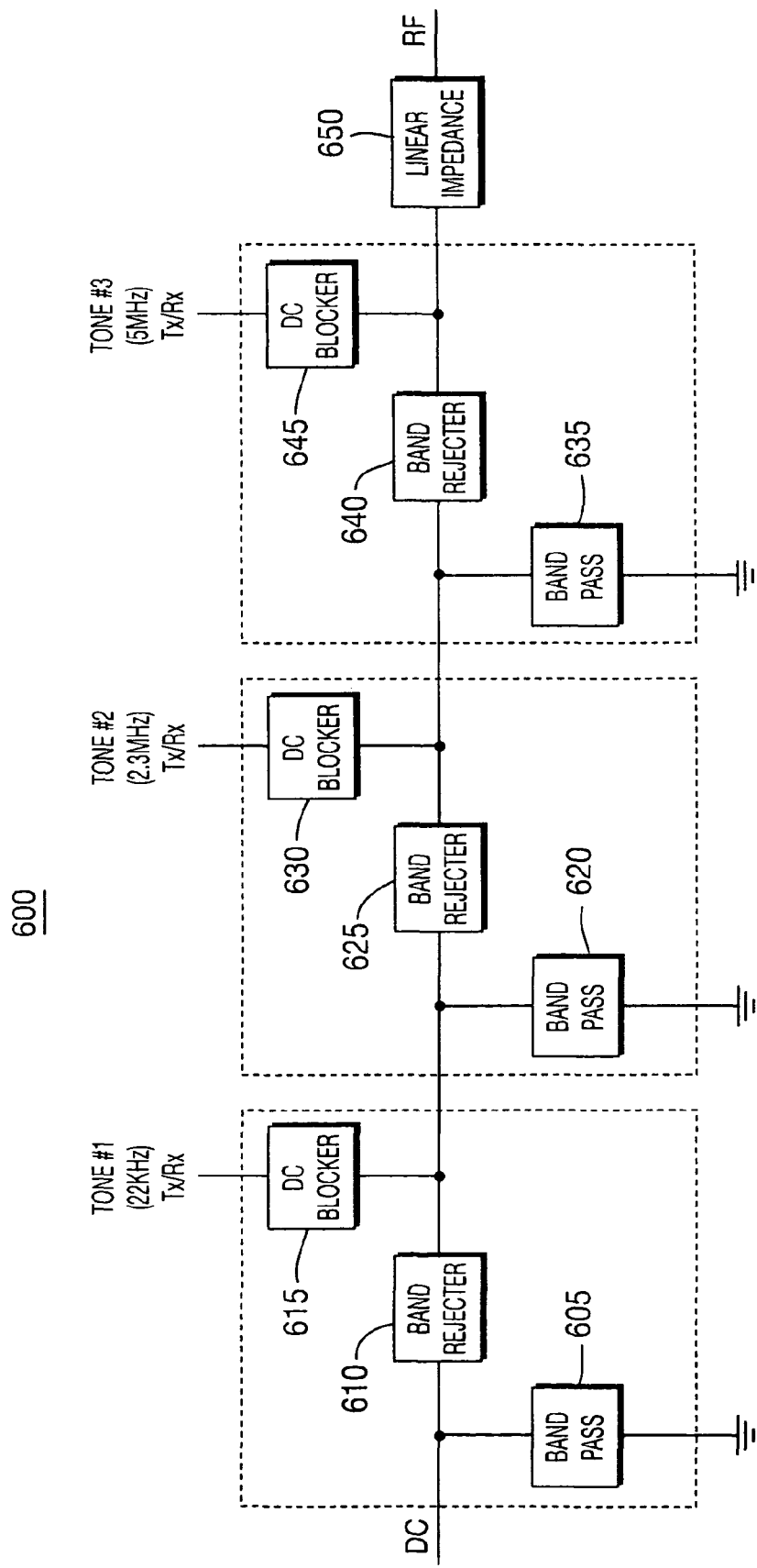
FIG. 6 is a block diagram showing details of a multi tone transceiver passive linear switch according to an exemplary embodiment of the present invention.

Referring now to FIG. 6, a block diagram showing details of a multi tone transceiver passive linear switch 600 according to an exemplary embodiment of the present invention is shown. The multi tone transceiver passive linear switch 600 according to an exemplary embodiment of the present invention comprises a first, second, and third DC blocker circuit 615 630 645, a first, second and third band rejecter circuit 610 625 640, a first, second, and third band pass circuit 605 620 635 and a linear impedance 650.

The DC blocker circuits 615 630 645, band rejecter circuits 610 625 640, and band pass circuits 605 620 635 operate in a manner similar to that described with reference to FIG. 5. However, each DC blocker circuit 615, 630, 645 is operative to conduct a tone of a differing frequency to the RF signal path. For example, the first DC blocker 615 is operative to conduct a 22 kHz tone to the RF signal path. The second DC blocker 630 is operative to conduct a 2.3 MHz signal to the RF signal path. The third DC blocker circuit 645 is operative to conduct a 3.1 MHz signal to the RF signal path.

Similarly, the band rejecter circuits 610 625 640 are operative to conduct the DC power supply voltage to the RF signal path, but to prevent any tone signal from being conducted back to the DC power supply. For example, the third band reject circuit 640 is operative to conduct DC voltage, the 2.3 MHz tone signal, and the 22 kHz tone signal, but to prevent the conduction of the 3.1 MHz tone signal. The second band rejecter circuit 625 is operative to conduct DC voltage and the 22 kHz tone signal, but to prevent the conduction of the 2.3 MHz tone signal and the 5 MHz tone signal. The first band rejecter circuit 610 is operative to conduct DC voltage, but to prevent the conduction of the 22 kHz tone signal, the 2.3 MHz tone signal and the 3.1 MHz tone signal.

The band pass circuits 605 620 635 are operative to isolate the DC voltage from the source of ground potential, yet to couple unwanted tone and RF signals to the source of reference potential. Thus, the first band pass circuit 605 is operative to isolate the DC signal from the source of reference potential, but to couple all unwanted tone and RF signals, such as the 22 kHz, 2.3 MHz and 3.1 MHz signals, to the source of reference potential. The second band pass circuit 620 is operative to isolate the DC supply voltage and the 22 kHz tone from the source of reference potential, and to couple the 2.3 MHz and 3.15 MHz signals to the source of reference potential. The third band pass circuit 635 is operative to isolate the DC supply voltage, the 2.3 MHz and the 22 kHz tone from the source of reference potential, and to couple the 3.1 MHz signal to the source of reference potential.

The linear impedance 650 is operative to provide impedance to the RF signal to the tuner. This impedance is operative to prevent the coupling of the RF satellite signals to ground.

Figure 7:
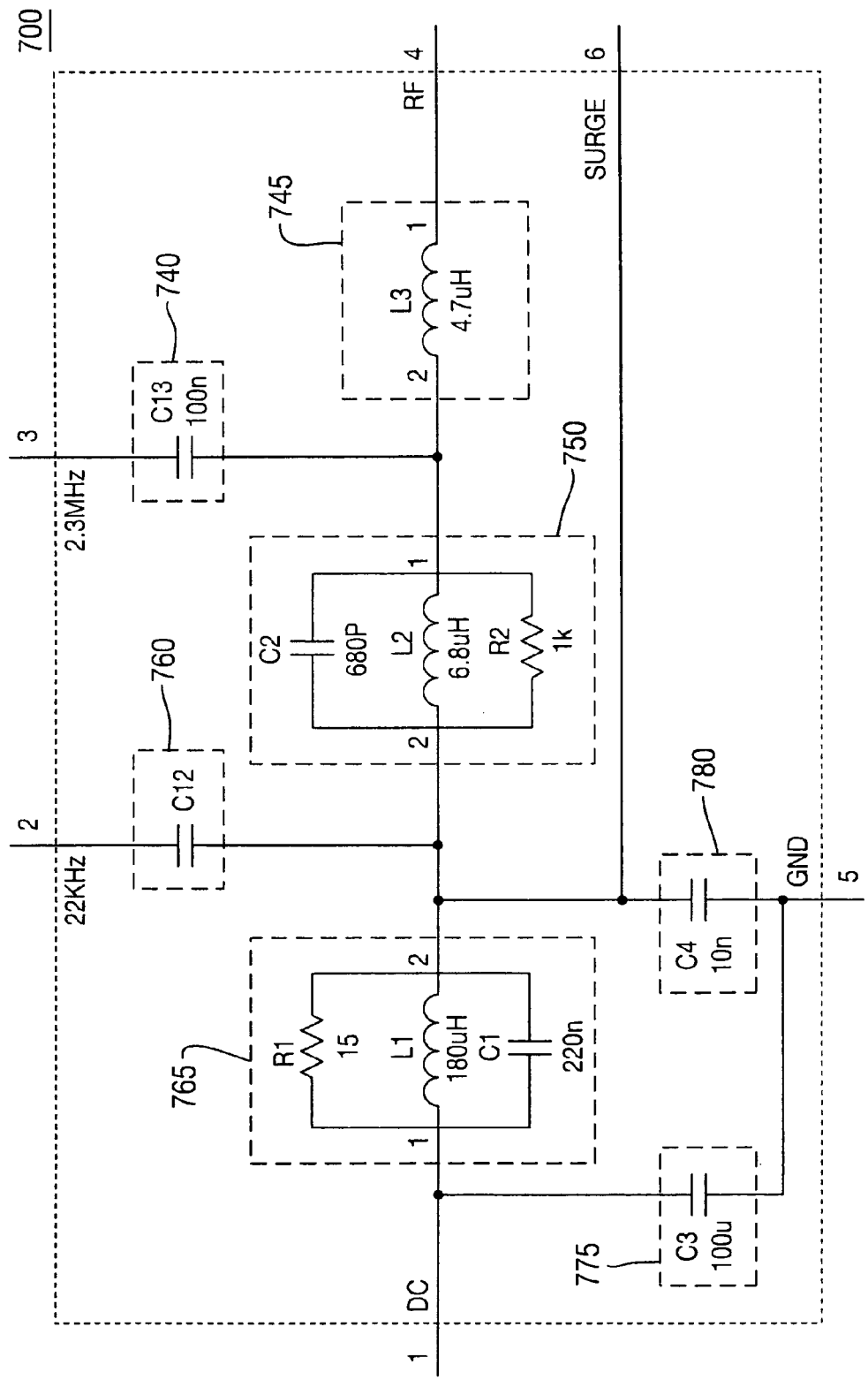
FIG. 7 is a block diagram showing details of a 6 port linear network SWM LNB switch according to an exemplary embodiment of the present invention.

Referring now to FIG. 7, a block diagram showing details of a 6 port linear network SWM LNB switch 700 according to an exemplary embodiment of the present invention is shown. FIG. 7 depicts a specific embodiment of the 6 port linear network switch 402 depicted in FIG. 4. The 6 port linear network SWM LNB switch comprises a coupling to the RF input 4, a coupling to a surge protection circuit 6, a coupling to a source of reference potential or ground 5, a coupling to a source of DC voltage 1, a coupling to a 22 kHz transceiver 2 and a coupling to a 2.3 MHz transceiver 3. The 6 port linear network SWM LNB switch 700 further comprise a DC blocker 22 kHz blocker 2.3 MHz pass circuit 740, a 5-30 MHz linear impedance circuit 745, a 2.3 MHz band rejecter circuit 750, a first DC blocker 22 kHz pass 2.3 MHz pass circuit 760, a 22 KHz blocker circuit 765, a second DC blocker 22 kHz pass 2.3 MHz pass circuit 775 and a third DC blocker 22 kHz blocker 2.3 MHz pass circuit 780.

A second DC blocker 22 kHz blocker 2.3 MHz pass circuit 740 is operative to conduct the 2.3 MHz SWM signal, but prevent 22 KHz signals and DC voltages from being conducted to the 2.3 MHz Transceiver 3. In this exemplary embodiment, the second DC blocker 22 kHz blocker 2.3 MHz pass circuit 740 is implemented using a 100 nF capacitor C13. The 5-30 MHz linear impedance circuit 745 is operative to transmit and receive 22 KHz signals, 2.3 SWM signals, and DC voltage to the LNB, antenna, or other switching circuitry. Furthermore, the 5-30 MHz linear impedance circuit 745 is operative to prevent transmission of the RF satellite signals present at the RF input 4 through to the transceivers coupling points 2 3 and the DC power supply 770. In this exemplary embodiment, the 5-30 MHz linear impedance circuit 745 is implemented using a 4.7 µH inductor L3.

The 2.3 MHz band rejecter circuit 750 is operative to conduct a DC voltage from the source of DC voltage 1 and the 22 kHz signal from the coupling to the 22 kHz transceiver 2. The 2.3 MHz band rejecter circuit 750 is further operative to impede the conductance of the 2.3 MHz signal. In this exemplary embodiment, the 2.3 MHz band rejecter circuit 750 is implemented using a parallel RLC circuit with a 680 pF capacitor C2, a 6.8 µH inductor L2 and a 1 kΩ resistor R2.

The first DC blocker 22 kHz pass 2.3 MHz pass circuit 760 is operative to conduct the 22 KHz signal from the coupling to the 22 KHz transceiver 2, but to prevent 2.3 MHz signals and DC voltages from being conducted to the coupling to the 22 kHz Transceiver 2. In this exemplary embodiment, the first DC blocker 22 kHz pass 2.3 MHz pass circuit 760 is implemented using a capacitor C12. The 22 KHz blocker circuit 765 is operative to conduct the DC power and any 2.3 MHz signal, but to impede the 22 kHz signal generated by the 22 kHz transceiver 455. In this exemplary embodiment, the 22 KHz blocker circuit 765 is implemented using a parallel RLC circuit with a 220 nF capacitor C1, a 180 µH inductor L1 and a resistor R1.

A second DC blocker 22 kHz pass 2.3 MHz pass circuit 775 is operative to isolate the DC voltage to from the source of reference potential, but to pass both 22 kHz and 2.3 MHz signals to ground. In this exemplary embodiment, the second DC blocker 22 kHz pass 2.3 MHz pass circuit 775 is implemented using a 100 µF capacitor C3. The third DC blocker 22 kHz blocker 2.3 MHz pass circuit 780 is operative to isolate the DC voltage and the 22 kHz signal from ground but to conduct the 2.3 MHz signals to ground.

Figure 8:
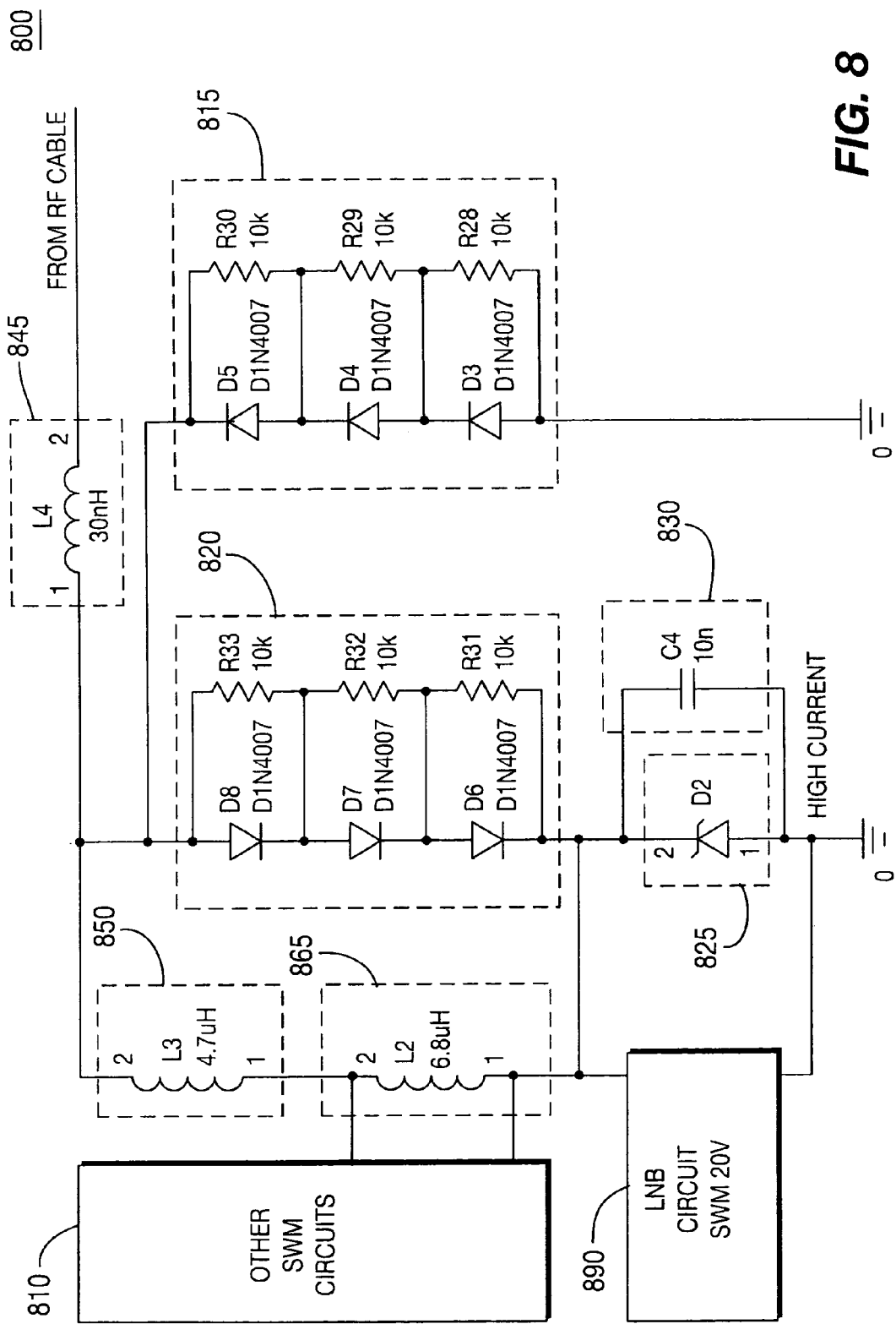
FIG. 8 is a block diagram showing details of a two stage surge protector according to an exemplary embodiment of the present invention.

Referring now to FIG. 8, a block diagram showing details of a two stage surge protector circuit 800 according to an exemplary embodiment of the present invention is shown. FIG. 8 depicts a specific embodiment of the two stage surge protector circuit 401 depicted in FIG. 4. The two stage surge protector circuit 800 comprises a 2.3 MHz high impedance negative surge path 815, a 2.3 MHz high impedance positive surge path 820, a low impedance surge path 825, a first DC blocker 22 kHz blocker 2.3 MHz pass circuit 830, a linear impedance circuit 845, a 2.3 MHz band rejecter circuit 850, a 22 KHz blocker circuit 865, SWM circuitry 810 and LNB SWM power supply circuit 890.

The coupling to the RF input is operative to receive RF signals from the LNB and is further operative to provide a coupling the SWM circuit 810 and LNB SWM power supply circuit 890. The RF input 405 is generally the point most likely to be the point of entry to the circuitry of lightning surge and other environmental electrical disturbances. The 2.3 MHz high impedance negative surge path 815 is operative to conduct negative surges to ground, while presenting high impedance to 2.3 MHz signals. In this exemplary embodiment, the 2.3 MHz high impedance negative surge path 815 is implemented using three parallel resistor diode pairs D3 D4 D5 R30 R29 R28 in series. The 2.3 MHz high impedance positive surge path 820 is operative to conduct positive surges to low impedance surge path 825, while presenting high impedance to 2.3 MHz signals. In this exemplary embodiment, the 2.3 MHz high impedance positive surge path 820 is implemented using three parallel resistor diode pairs D6 D7 D8 R31 R32 R33 in series. The low impedance surge path 825 is operative to conduct operative to conduct the 2.3 MHz to ground, to block the conduction of the 22 KHz tone to ground, operative to conduct the high current surge pulse to ground. An exemplary implementation of the low impedance surge path 825 is a zener diode D2. Thus, any high current surge passing through the 2.3 MHz high impedance positive surge path 820 will be clamped by the zener diode. The first DC blocker 22 kHz blocker 2.3 MHz pass circuit 830 is operative to conduct the 2.3 MHz signal to ground and to compensate for any non linear effects resultant from the low impedance surge path 825. In this exemplary embodiment, the 2.3 MHz high impedance positive surge path 820 is implemented using a 10 nF capacitor C4.

In this exemplary embodiment the 2.3 MHz band rejecter circuit 850 is implemented using a 4.7 µH inductor L3, and the 22 KHz blocker circuit 865 is implemented using a 6.8 µH inductor L2. SWM circuitry 810 is operative to transmit and receive SWM and DiSEqC control signals. The LNB SWM power supply circuit 890 is operative to supply DC voltage to the LNB and SWM circuits as required.

As described herein, the present invention provides an architecture and protocol for enabling signal communications between an SWM and an IRD within a dwelling. While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An apparatus comprising:
 a first DC voltage block coupled between a source of a first RF signal and a first transmission line, said first RF signal having a first frequency;
 a second DC voltage block coupled between a source of a DC potential and a source of reference potential; and
 a first band reject filter for rejecting said first frequency, coupled between said source of the DC potential and the first transmission line;
 a third DC voltage block coupled between a source of a second RF signal and a second transmission line, said second RF signal having a second frequency;
 a second band reject filter for rejecting said second frequency, coupled between said first transmission line and the second transmission line; and
 a low pass filter coupled between the first transmission line and the source of reference potential.

2. The apparatus of claim 1 wherein said first DC block comprises a high pass filter.

3. The apparatus of claim 1 wherein said second DC block comprises a high pass filter.

4. The apparatus of claim 1 wherein said first band reject filter comprises a resistor, capacitor and inductor arranged in parallel.

5. The apparatus of claim 1 wherein said first band reject filter is configured to reject a 22 kHz DiSEqC tone.

6. The apparatus of claim 1 wherein said second band reject filter is configured to reject a 2.3 MHz signal.

7. The apparatus of claim 1 further comprising a linear inductance between said second transmission line and a tuner.

8. The apparatus of claim 1 wherein said second frequency is higher than said first frequency.

9. An apparatus comprising:
 a first DC voltage block coupled between a source of a first RF signal and a first transmission line, said first RF signal having a first frequency;
 a second DC voltage block coupled between a source of a DC potential and a source of reference potential; and
 a first band reject filter for rejecting said first frequency, coupled between said source of the DC potential and the first transmission line;
 wherein said second DC voltage block is operative to conduct a 22 kHz signal and a 2.3 MHz signal to said source of reference potential.

10. An apparatus comprising:
 a first DC voltage block coupled between a source of a first RF signal and a first transmission line, said first RF signal having a first frequency;
 a second DC voltage block coupled between a source of a DC potential and a source of reference potential; and
 a first band reject filter for rejecting said first frequency, coupled between said source of the DC potential and the first transmission line;
 wherein said second means for blocking a DC voltage is operative to conduct a 22 kHz signal and a 2.3 MHz signal to said source of reference potential.

* * * * *